United States Patent [19]
Hofbauer et al.

[11] Patent Number: 5,905,350
[45] Date of Patent: May 18, 1999

[54] POSITION MEASURING SYSTEM AND MEASURING PROCESS

[75] Inventors: Hermann Hofbauer, Trostberg; Steffen Bielski, Garching; Helmut Huber, Garching/Wald, all of Germany

[73] Assignee: Dr. Johannes Heidenhain GmbH, Traunreut, Germany

[21] Appl. No.: 08/936,974

[22] Filed: Sep. 25, 1997

[30] Foreign Application Priority Data

Sep. 25, 1996 [DE] Germany .............................. 196 39 316

[51] Int. Cl.⁶ .................................. H02P 6/00; H02P 6/20
[52] U.S. Cl. .......................... 318/601; 308/608; 308/430; 308/439
[58] Field of Search ..................................... 318/138, 254, 318/430, 431, 439, 600, 601, 602, 604, 605, 608

[56] References Cited

U.S. PATENT DOCUMENTS

| | | |
|---|---|---|
| 3,982,106 | 9/1976 | Stutz . |
| 4,849,680 | 7/1989 | Miyamoto ................................ 318/602 |
| 5,530,331 | 6/1996 | Hanei ....................................... 318/592 |

FOREIGN PATENT DOCUMENTS

| | | |
|---|---|---|
| 2 416 212 | 4/1974 | Germany . |
| 195 13 692 C1 | 4/1995 | Germany . |
| WO 89/11080 | 5/1988 | WIPO . |

*Primary Examiner*—Bentsu Ro
*Attorney, Agent, or Firm*—Brinks Hofer Gilson & Lione

[57] ABSTRACT

A position measuring system to determine the absolute angle position of a rotor of a motor during startup. With this absolute angle position, correct commutation for startup of the motor is provided. During later operation a high-precision incremental angle measurement is possible. For this purpose a switching unit is disposed between a rotary transducer and an evaluation unit, which is driven in such a manner that first the analog signals necessary for the determination of the absolute angle position are input to the evaluation unit and thereafter the analog signals required for incremental angle measurement are input to the evaluation unit. In order to avoid unacceptable incorrect positioning in case of incorrect switching between the first and second modes of operation, all the analog signals have an approximately equal spacing period.

25 Claims, 4 Drawing Sheets

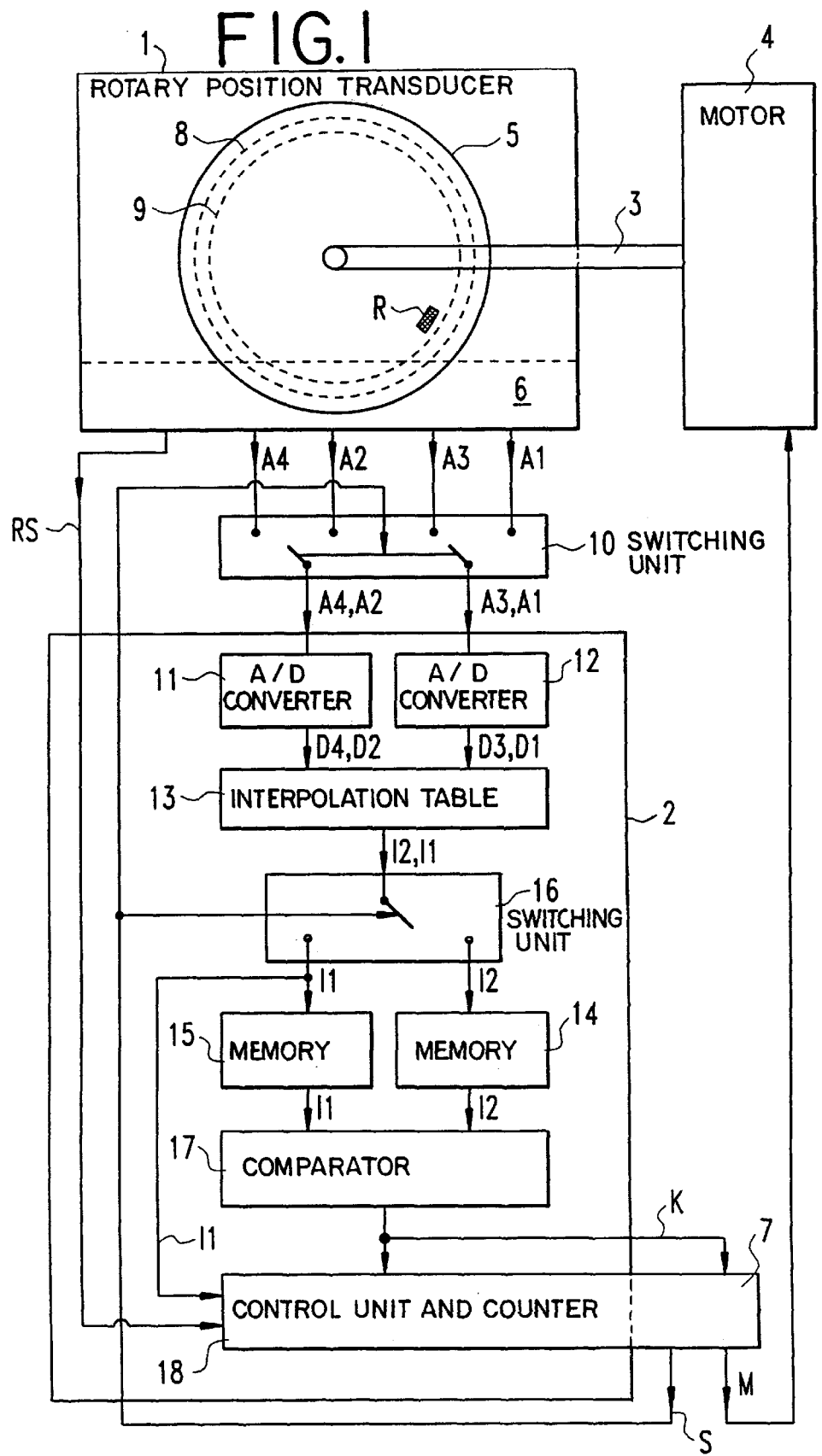

POSITION MEASURING SYSTEM AND MEASURING PROCESS

BACKGROUND OF THE INVENTION

The invention relates to a position measuring system and a measuring process for determining an absolute position.

In a large number of electric motors it is necessary to determine the absolute position of the rotor during startup so that when the rotor is turned on, the ampere-turns of its coils lie at a right angle to the axis of rotation so that the rotor starts up in the desired rotational direction with the desired torque. The range of the angle within which the absolute position must be known is dependent on the setup of the electric motor. In order to be able to install an angle measuring system flexibly, it is customary to determine the absolute position for commutation of an electric motor over one complete revolution. In subsequent operation the angle measuring system should output the position of the rotor with as high a precision as possible.

PCT Publication No. WO 89/11080 discloses a position measuring system with two spacing tracks whose spacing periods differ negligibly. The phase difference between the analog signals generated by scanning the two tracks is determined and from the detected phase differences, signals are generated that serve for commutation of an electric motor.

German Patent Publication No. DE 195 13 692 C1 discloses another position measuring system which outputs signals for commutation of a motor. The device includes a scale that has a first track that has only a single period per revolution of the scale, i.e., a low resolution track, and a second track that has many periods per revolution of the scale, i.e., a high resolution track. In a first operating mode the absolute position of the scale is determined by scanning the low resolution track and evaluating the analog signal generated from scanning the low resolution track. In a second operating mode, the scale is to rotated to a desired position. A switching unit switches the operation of the device from the first mode of operation to the second mode of operation. In the second mode of operation the high resolution track is scanned. In this second operating mode the desired position to which the scale is to be located is specified as a number of increments. An increment is defined in terms of one period or a fraction of one period. As an example, if one increment equals one period and if the desired position requires the scale to be rotated 100 increments in the second mode of operation, then the scale is revolved until such a time as 100 periods have been detected by a counter. If the switching unit has correctly placed the device in the second mode of operation, the scale will have been rotated only a fraction of one revolution because the high resolution track has many periods. However, if the switching unit has not correctly placed the device in the second mode of operation then the low resolution track is still being scanned and because it has only one period per revolution, the scale will be rotated 100 revolutions in order for the counter to count 100 increments. Thus if the switching unit does not properly operate, considerable mispositioning of the scale occurs.

Thus it is desirable to provide a position measuring system and a measuring process in which this type of grossly incorrect positioning is avoided. It is also desirable to provide a position measuring system and measuring process in which only slightly incorrect positioning is able to occur if a malfunction of the switching unit occurs.

SUMMARY OF THE INVENTION

According to a first aspect of the invention there is provided a position measuring device having a scale that has at least a first periodic spacing track with a first spacing period and a second periodic spacing track with a second spacing period wherein the first and second spacing periods differ from one another only negligibly disposed on the scale, a sampling unit coupled to the scale for scanning the first and second periodic spacing tracks and for generating analog sampling signals. The device includes a change-over switch unit, a control unit coupled to the change-over switch unit which outputs a control signal to the change-over switch which places the device in either a first mode of operation or a second mode of operation, wherein in the first mode of operation the analog sampling signals for both periods are input simultaneously or sequentially to an evaluation unit which outputs an absolute position from instantaneous values of the sampling signals for both periods, and wherein in the second mode of operation at least one of the sampling signal for one of the two periods is input to the evaluation unit which outputs a high-resolution measured value of position from the instantaneous value of a sampling signal for only one of the two periods.

A position measuring process for the determination of an absolute position of a movable part having a scale that has at least a first periodic spacing track having a first spacing period and a second periodic spacing track having a second spacing wherein the first spacing is negligibly different from the second spacing period. The process includes the steps of sampling the first and second periodic spacing tracks, generating sampling signals for a first and a second period, in a first mode of operation inputting the sampling signals to an evaluation unit, in a first mode of operation outputting a low-resolution absolute position from the evaluation unit, in a second mode of operation dividing one of the two sampling signals of the first and second period in an interpolation unit, and in a second mode of operation outputting a high-resolution measured value of position from the interpolation unit.

BRIEF DESCRIPTION OF THE DRAWINGS

FIG. 1 is a schematic illustration of an angle measuring system according to a preferred embodiment of the present invention.

DETAILED DESCRIPTION OF THE PRESENTLY PREFERRED EMBODIMENTS

Figure 2A:
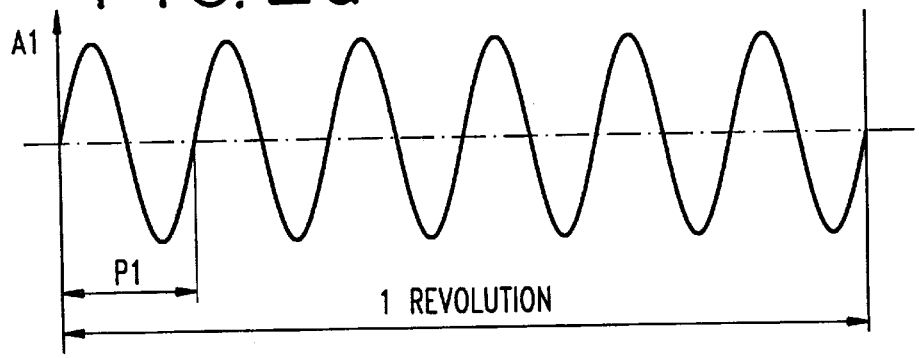
FIGS. 2a–e are graphs of the analog signals generated by the angle measuring system shown in FIG. 1.
Figure 2B:
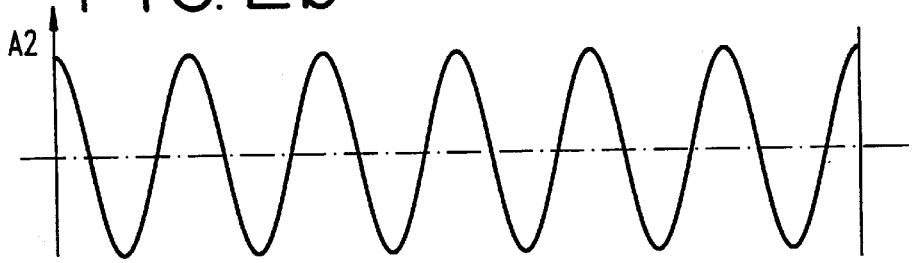
Figure 2C:
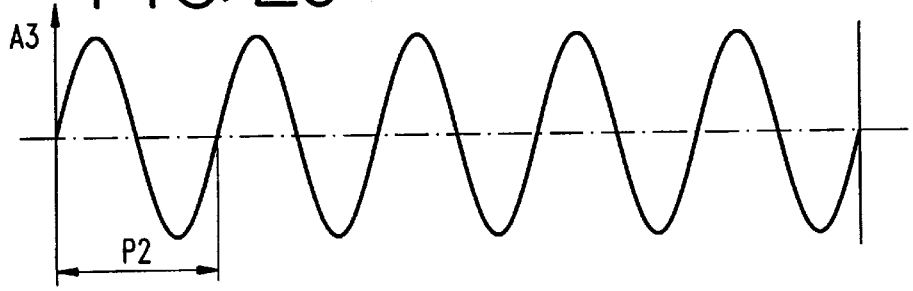
Figure 2D:
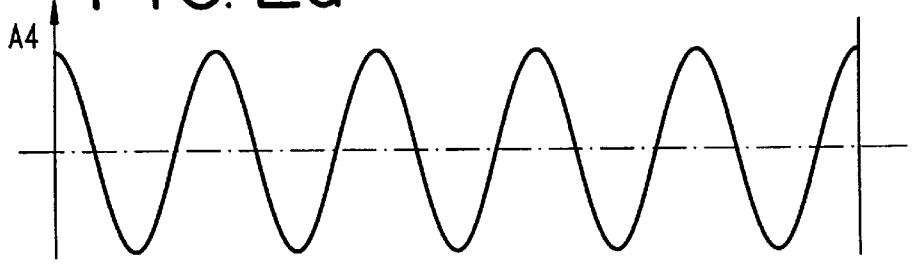

FIG. 1 is a schematic illustration of an angle measuring system according to a preferred embodiment of the present invention. The angle measuring system includes a transducer 1, an evaluation unit 2, a motor 4, a switching unit 10 and a control unit 7. The transducer 1 includes a scale plate 5 and a scanning unit 6. The scale plate 5 is coupled to the motor 4 by a shaft 3. In a preferred embodiment, the transducer 1 is a rotary position transducer as shown. The scale plate 5 has a first periodic spacing track 8 and a second periodic spacing track 9. Each of the spacing tracks 8 and 9 has a plurality of spacing periods P1 and P2 respectively over one revolution of the scale plate 5. The spacing periods P1 and P2 differ negligibly from one another. In a preferred embodiment the first periodic spacing track 8 has N spacing periods P1 per revolution, and the second periodic spacing track 9 has N–1 spacing periods P2 per revolution.

Figure 2E:
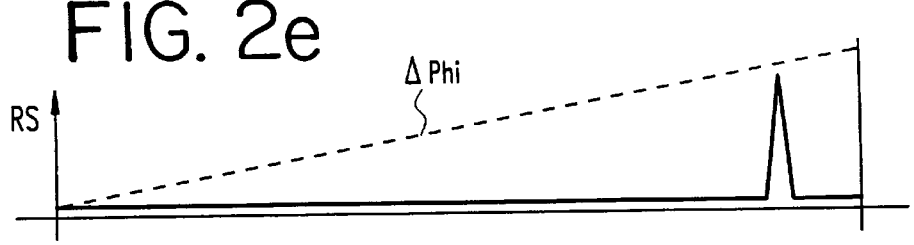

The scanning unit 6 scans the first and second periodic spacing tracks 8 and 9 and generates analog signals A1, A2, A3 and A4. In particular, analog signals A1, A2 are generated by the scanning unit 6 from scanning the first spacing track 8 and analog signals A3, A4 are generated by the scanning unit 6 from scanning the second spacing track 9. The scale plate 5 also has a reference mark R disposed thereon. The scanning unit 6 generates a reference signal RS when the reference mark is scanned. The scanning unit 6 will not be described in greater detail since scanning units are well known to those of ordinary skill in the art. FIGS. 2a–e are graphs illustrating the analog signals A1, A2, A3, A4 and reference signal RS respectively. It can be seen from FIGS. 2a–d that analog signals A1, A2 and A3, A4 are phase-shifted with respect to one another by 90°. In FIG. 2e the course of the phase difference ΔPhi is shown over one revolution of scale plate 5.

In a preferred embodiment the evaluation unit 2 includes a first and a second analog-to-digital converter 11, 12; an interpolation table 13; a second switching unit 16; a first and a second memory 14, 15; a comparator 17 and a counter 18. The switching unit 10 couples the transducer 1 to the evaluation unit 2 as will be described in greater detail hereinafter. The evaluation unit 2 is coupled to the input of the control unit 7 and supplies an absolute position signal K to the control unit 7 which will be described hereinafter. The control unit 7 has one output coupled to the motor 4 and supplies the motor 4 with a motor current signal M. The control unit 7 has a second output that is coupled to both the first and second switching units 10 and 16. The analog signals A1, A2, A3 and A4 are input to the switching unit 10 and reference signal RS is input to counter 18.

Operation of the position measuring device will now be described. The position measuring device is operated in either a first mode of operation or a second mode of operation. In the first mode of operation, the instantaneous absolute position of the shaft 3 is determined. The absolute position of the shaft 3 needs to be determined during startup of the motor 4 so that the correct amount of current can be applied to the motor 4 for commutation to place the motor in the desired position. In the second mode of operation, a high-resolution measurement signal is generated to determine the rotation of the shaft 3 and thereby determine if the motor 4 has reached the desired position. The mode of operation of the position measuring device is controlled by control unit 7. In the first mode of operation, a control signal S is input to the first and second switching units 10 and 16 and places the first and second switching units 10, 16 in the state shown. When the first switching unit 10 is in this state, analog signals A3 and A4, which are generated by scanning the second periodic scanning track 9, are input to analog-to-digital converters 12 and 11 respectively of the evaluation unit 2. Analog-to-digital converters 11, 12 convert analog signals A3 and A4 to digital signals D3 and 1D4 and input these digital signals to the interpolation table 13 located downstream of the converters 11, 12. The digital signals D3 and D4 are used as addresses in the interpolation table 13 as is well-known to those of ordinary skill in the art. An instantaneous absolute position signal 12 is output from the interpolation table 13. This absolute position I2 is determined with very high resolution and precision due to the instantaneous signal amplitude values of the analog sampling signals A3, A4 within one spacing period P2. The absolute position 12 is coupled through the second switching unit 16 to memory 14 where it is stored.

Control unit 7 then outputs a control signal that causes the first and second switching units 10, 16 to change state so that analog signals A1 and A2 which are generated by scanning the first periodic track 5 are now input to the analog-to-digital converters 11, 12. Digital values D1, D2 output by analog-to-igital converters 11, 12 are input to interpolation table 13 and a value is determined in the interpolation table 13 which specifies the instantaneous absolute position I1 within a spacing period P1. This absolute position I1 is coupled through the second switching unit 16 to the first memory 15 where it is stored. Alternatively the analog signals A1, A2, A3, A4 may be simultaneously input to the evaluation unit 2 as will be described with reference to FIG. 3.

As already mentioned, the spacing periods P1 and P2 are negligibly different from one another and the difference between the spacing periods P1 and P2 is chosen so that an absolute position can be determined unambiguously within one revolution of the scale plate 5 from the phase difference of the analog signals A1, A2, A3, A4. The phase difference of the analog signals can be simulated particularly simply by comparing the interpolated values I1 and I2. In order to accomplish this the comparator 17 receives the interpolated values I1 and I2 from memories 14, 15. The comparator 17 compares the interpolated values I1 and I2 and outputs an absolute position signal K to both the counter 18 and control unit 7. The resolution of the absolute position as well as the precision with which this absolute position must be determined is dependent on the motor 4 to be commuted. Resolution and precision sufficient for commutation must be guaranteed.

Once the absolute position of the scale plate 5 and thus the motor 4 has been determined, the scale plate 5 needs to be rotated to a desired position. In order to rotate the scale plate 5 to a desired position the position measuring device is placed in the second mode of operation. In this second mode of operation the control unit 7 generates a motor current signal M for startup of the motor 4 and applies the current signal M to the motor 4 so that the motor will be rotated to its desired position.

In the second mode of operation the position of the motor needs to be determined so that it can be determined if it has reached its desired position. To accomplish this the control unit 7 outputs a control signal S which causes the first switching unit 10 to be in a state where only analog signals A1 and A2 generated from scanning the first periodic spacing track 8 are input to the evaluation unit 2. The second switching unit 16 is in a state so that interpolated value I1 is input to memory 15 and also input to counter 18 where the counter 18 performs incremental measuring as is well known to those of ordinary skill in the art. The measured values of the position registered by the counter 18 during the second mode of operation are input to control unit 7 which inputs the appropriate current M to the motor 4 according to prior art practices.

It is also possible to set the counting state of the counter 18 to the absolute position value K before beginning the incremental measurement. An exact synchronization of the counter 18 is done during sampling of a reference mark R. Since the absolute position of the reference mark R is known, after the first scan of this reference mark R in connection with the incremental measured values I1, a high-precision measured value of absolute position is available in the counter 18. The reference mark R consists according to prior art practices of a combination of spacing lines that extend over several spacing periods P1 of the incremental spacing 8. During the scanning of this reference mark R, the reference mark signal RS is generated that unambiguously assigns a pulse to at least one definite spacing period P1 of the track 8. The absolute position assigned to this period P1 is stored in a memory (not shown) and is input to the counter 18 as its counting state on occurrence of the pulse. With optimization of the reference mark R, it is even possible to unambiguously assign an absolute position to a fractional part of a spacing period with the pulse. In the example given, only a single reference mark R per revolution is shown.

Alternatively, several reference marks at equal or unequal intervals over the circumference of the scale plate 5 can also be provided. Providing reference marks at unequal intervals has the advantage that, during operation, the absolute position can be registered with high precision by counting the increments between each two reference marks. The evaluation process therefor is well-known to those of ordinary skill in the art as described in U.S. Pat. No. 3,982,106. In the case of several reference marks at equal intervals within one revolution of the scale plate 5, the absolute position for each reference mark is stored in a memory. In order to read out the correct memory content during sampling of one of the reference marks, different coding characteristics can be assigned to the reference marks. A particularly advantageous coding is given in the case of the inventive position measuring system by the low-resolution absolute position K. If, for example, three reference marks are provided, one at 0°, another at 120°, and a third at 240°, and the absolute position K can be specified with a precision of ±10°, then it can be determined unambiguously that the first reference mark must lie within the first range of 350° to 10°, the second within the second range of 110° to 130°, and the third within the third range of 230° to 250°. If one of the three reference marks is sampled and is, for example, K=7°, then the counter can be set to the absolute position 0° assigned unambiguously to the first reference mark and in fact with the precision of the reference mark position.

If one compares the angle measuring system shown in FIG. 1 with the apparatus described in German Patent Publication No. DE 195 13 692 C1 described in the background, it is clear that with the angle measuring system according to the present invention it is guaranteed that in case of an incorrect setting of the switching 10 unit only a slightly incorrect positioning can result because the difference in the spacing periods of the first and second tracks 8, 9 are negligible whereas in the positioning device taught by the German reference they are not. A particular advantage of the present invention is that the low-resolution measurement of absolute position necessary for initial commutation as well as the subsequent incremental high-resolution and high-precision measurement of position can be realized using the same components 11, 12 and 13.

In order to detect an incorrect switch setting in the incremental measurement processes during operation, a monitoring apparatus (not shown) can be provided that registers the number of increments or periods that are fed to the counter 18 between two reference mark signals RS and compares them to predetermined theoretical values. If the number of increments registered deviates from the theoretical value by a predetermined tolerance value (optimal=0), the switching unit 10 can be reset and/or an error or warning signal issued.

Even if the first and second switching units 10, 16 are not correctly switched to the second mode of operation, at most only one incorrect position of a period length P1 may occur within one complete revolution of the scale plate 5. Since for incremental measurement, the period length P1 is to be as small as possible, several hundred periods P1 are present within one revolution as a rule so that the maximum possible incorrect positioning is very small. In practice P1=360°/2048 and P2=360°/2047, for example.

On the example shown, the interpolation is done using a table 13 but the interpolation can also be performed by a computer. The entire evaluation can be carried in a microprocessor in the form of executable routines and the present invention is not limited to the particular structure shown in FIG. 1. The analog signals A1, A2, A3, A4 and RS can be obtained using optoelectric, capacitive, magnetic, or inductive sampling principles.

The switching unit 10 can be a component of the evaluation unit 2 or of the transducer 1. Through the integration of switching unit 10 into the transducer 1, transmission lines to the evaluation unit 2 can be spared, which is particularly advantageous if the evaluation unit 2 is assigned to the control unit 7 or is integrated into the control unit 7. It is also possible to integrate the switching unit 10 and the evaluation unit 2 into the transducer 1.

Figure 3:
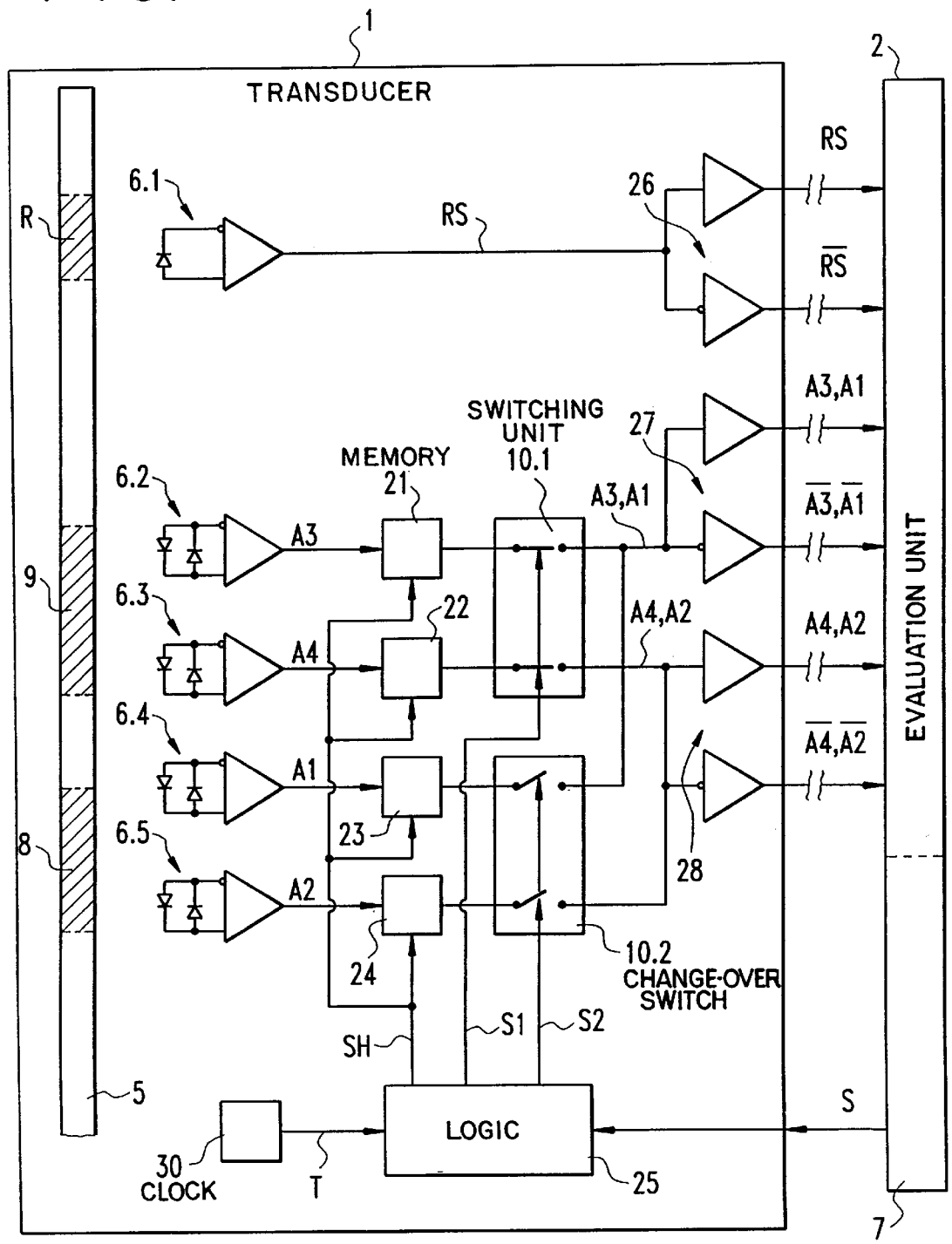
FIG. 3 is a schematic illustration of an angle measuring system according to another preferred embodiment of the present invention.

In order to be able to detect the instantaneous values of the analog signals A1, A2, A3, A4 at the same point in time, it is furthermore possible that memories for the simultaneous transfer of all instantaneous values of the analog signals A1 to A4 are disposed before the switching unit 10. An example thereof is shown in FIG. 3. In this preferred embodiment, switching units 10.1 and 10.2 are incorporated in the transducer 1 itself. The transducer 1 has a scale plate 5; scanning elements 6.1, 6.2, 6.3, 6.4, 6.5; memories 21, 22, 23, 24; switching units 10.1, 10.2; logic 25; clock 30; and driver modules 26, 27, 28. The scale plate 5 is scanned by the scanning elements 6.1 to 6.5 which generate the analog signals A1, A2, A3, A4 and RS. Upon receiving a control signal S for the control unit 7, logic unit 25 causes the simultaneous transfer of all the instantaneous values of the analog signals A1 to A4 into the memories 21 to 24. Each of the analog signals A1, A2, A3, A4 except RS is input to its own memory 21, 22, 23 and 24 which stores those signals. Simultaneously, a control signal S1 is input to the switching unit 10.1 and a control signal S2 is input to switching unit 10.2 placing the switching units 10.1 and 10.2 in the states shown thereby causing the sampling signals A3, A4 to be output. Thereafter, the logic unit 25 outputs control signal SI, S2 which causes the second switching unit 10.2 to close and the switching unit 10.1 to open so that only the sampling signals A1 and A2 are output. Accordingly, in this first mode of operation the sampling signals A3, A4 and thereafter the sampling signals A1, A2 are conducted sequentially on common lines to a separately disposed evaluation unit 2 in order to determine the absolute position K. After this process, the device is switched to the second mode of operation for incremental measurement of the position of the scale plate 5 where the switching units 10.1, 10.2 are put in a state, to continuously conduct analog signals A3, A4 to the evaluation unit 2. The driver modules 26 to 28 are provided for each output line at the output of the transducer 1. These driver modules 26 to 28 are in the position to output for each analog signal A1 to A4 and RS, an analog signal of complementary phase $\overline{A1}$ to $\overline{A4}$ and $\overline{RS}$.

The startup of the motor 4 is communicated to the transducer 1 or the evaluation units 2 in the preferred embodiments previously described by the control signal S. It is also possible that the evaluation unit 2 or the transducer 1 monitors the power supply voltage present itself and accordingly recognizes the startup and generates the control signals S or S1, S2 independently thereof and causes the correct switching between the two modes of operation.

Figure 4A:
FIGS. 4a–e are graphs of signals generated by the measuring system shown in FIG. 3.
Figure 4B:
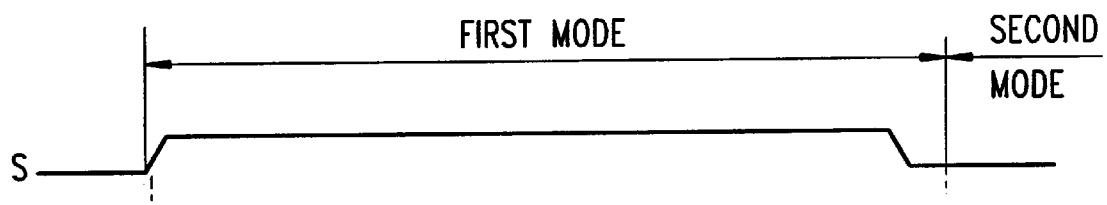
Figure 4C:
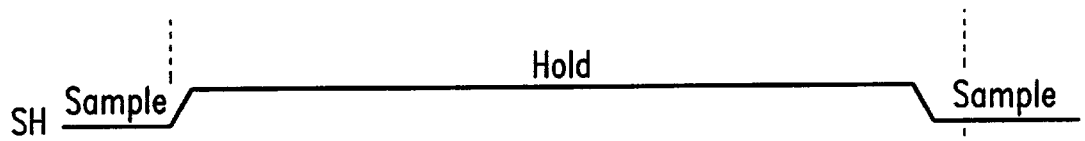
Figure 4D:
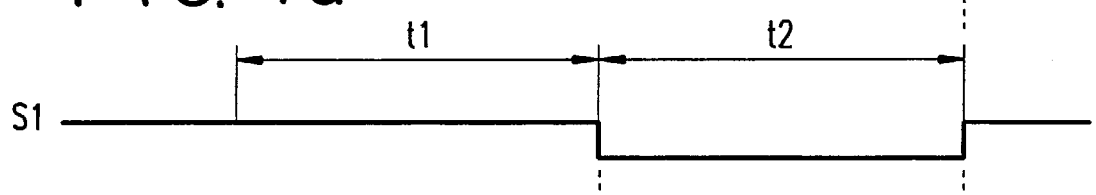
Figure 4E:
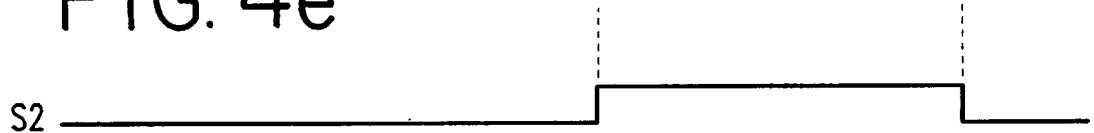

FIG. 4a–e are graphs of some of the signals generated by the position measuring device shown in FIG. 3. FIG. 4a is a graph of the output clock 30, FIG. 4b is a graph of the control signal S output by control unit 7, FIGS. 4c–e are graphs of the control signals SM, S1, S2, respectively output of the logic unit 25.

In FIG. 4, the change-over time-controlled by the logic unit 25 is shown. At the input of the logic unit 25, the signals T of a clock 30 are present. As shown in FIG. 4b with the control signal S present, the first mode of operation is initiated, and control signal SH (sample and hold) is output to memories 21–24, the instantaneous values of analog signals A1 to A4 to be stored in memories 21 to 24. During time period t1 (see FIG. 4d) control signals S1 and S2 cause switching unit 10.1 to close and switching unit 10.2 to open so that analog signals, A3, A4 are output by the transducer. During time period t2, the reverse happens and control signals S1 and S2 cause switching unit 10.1 to open and switching unit 10.2 to close so that analog signals A1, A2 are output by the transducer 1. After the second time period t2 has elapsed the device is placed in the second mode of operation where the sampling signals A3, A4 are continuously output by the transducer 1. The evaluation unit 2 coupled to the transducer 1 is the same as that illustrated in FIG. 1. In the preferred embodiment shown in FIG. 1 in the second mode of operation the incremental value I1 was continuously output to the evaluation unit 2 whereas in the preferred embodiment shown in FIG. 3 it is the incremental value I2 that is continuously output. In both embodiments either the value I1 or I2 could be used to performing the incremental measurement during the second mode of operation.

In the preferred embodiments described the absolute angle position K is determined by an interpolation table 13 and a computation step in comparator 17. In a manner not shown it is also possible to provide a module at whose inputs the sampling signals A1, A2, A3, A4 as well as the control signal S are present and at whose output in the first mode of operation the absolute position K is present and in the second mode of operation an incremental value I1 or I2 is present.

It is to be understood that the forms of the invention as described herewith are to be taken as preferred examples and that various changes in the shapes, size and arrangement of parts may be resorted to, without departing from the spirit of the invention or scope of the claims.

What is claimed is:

1. A method for determining the absolute position of a rotor of a motor during startup to allow substantially correct commutation of the motor, the method comprising the steps of:
   providing a scale plate having a first periodic track having a first period and a second periodic track having a second period wherein the first and second periods differ only negligibly wherein the scale plate is coupled to a shaft which is coupled to the rotor of the motor so that the scale plate rotates as the rotor rotates;
   operating the device in a first mode of operation wherein the absolute position of the scale plate is determined, the first mode of operation comprising the steps of:
      scanning the first and second periodic tracks;
      generating analog signals from scanning the first and second periodic tracks;
      generating a first interpolation value from the analog signals generated by scanning the first periodic track;
      generating a second interpolation value from the analog signals generated by scanning the second periodic track;
      comparing the first interpolation value with the second interpolation value;
      generating an absolute position signal from the comparison of the first and second interpolation values;
   switching the operation of the device to a second mode of operation wherein an incremental measurement of the movement of the scale plate is determined, the second mode of operation comprising the steps of:
      scanning either the first or second periodic track;
      generating analog signals from scanning either the first or second periodic track; and
      generating interpolation values from the analog signals generated by scanning the first or second periodic track.

2. A method according to claim 1 further comprising the step of inputting the absolute position signal to a control unit that is coupled to the motor wherein the control unit outputs a control signal to the motor which controls the startup of the motor.

3. A method according to claim 1 further comprising the steps of inputting the absolute position signal determined in the first mode of operation to a counter to set the counter state of the counter to the absolute position signal, and inputting the interpolation values determined in the second mode of operation to the counter wherein the counter state is increased from the counter state set in the first mode of operation by the interpolation values determined in the second mode of operation.

4. A method according to claim 1 further comprising the steps of:
   scanning a reference mark located on the scale plate wherein the reference mark is assigned an absolute reference position;
   generating a reference mark signal from scanning the reference mark;
   inputting the reference mark signal to a counter to set the counter state of the counter to the absolute reference position assigned to the reference mark.

5. A method according to claim 1 wherein the steps of generating the first and second interpolation values in the first mode of operation are performed sequentially.

6. A method according to claim 1 wherein the steps of generating the first and second interpolation values in the first mode of operation are performed simultaneously.

7. A method for determining the absolute position of a rotor of a motor during startup to allow substantially correct commutation of the motor, the method comprising the steps of:
   providing a scale plate coupled to the rotor of the motor so that the scale plate rotates as the rotor rotates, the scale plate having a first periodic track having a first period and a second periodic track having a second period wherein the first and second periods differ only negligibly wherein the scale plate is;
   determining an absolute position of the scale plate in a first mode of operation;
   measuring incremental movement of the scale plate in a second mode of operation; and
   switching between the first mode of operation and the second mode of operation.

8. A method according to claim 7 wherein the step of determining the absolute position of the scale plate comprises the steps of:
   scanning the first and second periodic tracks;
   generating analog signals from scanning the first and second periodic tracks;

generating a first interpolation value from the analog signals generated by scanning the first periodic track;

generating a second interpolation value from the analog signals generated by scanning the second periodic track;

comparing the first interpolation value with the second interpolation value; and generating an absolute position signal from the comparison of the first and second interpolation values.

9. A method according to claim 8 wherein the step of measuring incremental movement of the scale plate in the second mode operation comprises the steps of:

scanning either the first or second periodic track;

generating analog signals from scanning either the first or second periodic track; and generating interpolation values from the analog signals operated by scanning the first or second periodic track.

10. An apparatus for determining the absolute position of a rotor of a motor during startup to allow substantially correct commutation of the motor, the apparatus comprising;

a scale plate having a first periodic track having a first period and a second periodic track having a second period wherein the first and second periods differ only negligibly wherein the scale plate is coupled to a shaft which is coupled to the rotor of the motor so that the scale plate rotates as the rotor rotates;

a scanner, for scanning the first and second periodic tracks, and generating analog signals;

an evaluation unit coupled to the scanner for receiving the analog signals; and means for placing the evaluation unit in either a first or second mode of operation wherein in the first mode of operation;

the absolute position of the scale plate is determined, and in the second mode of operation the incremental measurement of the movement of the scale plate is determined.

11. An apparatus according to claim 10 wherein the means for placing the evaluation unit in either a first or second mode of operation comprises a switching unit coupled between the scanner and the evaluation unit wherein the switching unit allows analog signals generated from scanning both the first and second periodic tracks to be input to the evaluation unit during the first mode of operation but only allows analog signals generated from scanning the first periodic track to be input to the evaluation unit during the second mode of operation.

12. An apparatus according to claim 10 wherein the first periodic track has N spacing periods and the second periodic track has N-1 spacing periods.

13. A position measuring device having a scale that has at least a first periodic spacing track with a first spacing period and a second periodic spacing track with a second spacing period wherein the first and second spacing periods differ from one another only negligibly, a sampling unit coupled to the scale for scanning the first and second periodic spacing tracks and for generating analog sampling signals, the device comprising:

a switching unit;

a control unit coupled to the switching unit which outputs a control signal to the switching unit which places the device in either a first mode of operation or a second mode of operation, wherein in the first mode of operation the analog signals for both periods are input to an evaluation unit which outputs an absolute position from instantaneous values of the analog signals for both periods; and wherein in the second mode of operation at least one of the analog signal for one of the two periods is input to the evaluation unit which outputs a high-resolution measured value of position from the instantaneous value of an analog signal for only one of the two periods.

14. A position measuring device according to claim 13, further comprising at least one reference mark with a known absolute position provided on the scale, and an interpolation unit which, in the second mode of operation, has one of the analog signals continuously input thereto wherein the interpolation unit generates an interpolated value which is output to a counter wherein a synchronization signal is present at the counter during the sampling of the reference mark.

15. A position measuring device according to claim 13 wherein the scale is an scale plate of a rotary transducer and that the first periodic spacing track has N spacing periods and the second periodic spacing track has N-1 spacing periods per revolution.

16. A position measuring device according to claim 14 wherein the scale is an scale plate of a rotary transducer and that the first periodic spacing track has N spacing periods and the second periodic spacing track has N-1 spacing periods per revolution.

17. A position measuring process for the determination of an absolute position of a movable part having a scale that has at least a first periodic spacing track having a first spacing period and a second periodic spacing track having a second spacing period wherein the first spacing period is negligibly different from the second spacing period, the process comprising the steps of:

sampling the first and second periodic spacing tracks;

generating analog signals from scanning the first and second periodic spacing tracks;

in a first mode of operation inputting the analog signals to an evaluation unit;

in a first mode of operation outputting a low-resolution absolute position from the evaluation unit;

in a second mode of operation inputting only one of the two analog signals of the first and second period in an interpolation unit; and in a second mode of operation outputting a high-resolution measured value of position from the interpolation unit.

18. A position measuring process according to claim 17, further comprising the step of inputting the low-resolution absolute position determined in the first mode of operation to a control unit which controls the startup of the electric motor in response thereto.

19. A position measuring process according to claim 17, further comprising the step of inputting the high-resolution incremental measured value of position determined by interpolation in the second mode of operation to a counter whose counting state is set after the first mode of operation to the low-resolution absolute position determined thereby.

20. A position measuring system according to claim 18 further comprising the step of inputting the high-resolution incremental measured value of position determined by interpolation in the second mode of operation to a counter whose counting state is set after the first mode of operation to the low-resolution absolute position determined thereby.

21. A position measuring process according to claim 17 further comprising the step of inputting the high-resolution incremental measured value of position determined by interpolation in the second mode of operation to a counter whose counting state is set to a known absolute reference position assigned to a reference mark, in the case of initial sampling of a reference mark.

22. A position measuring process according to claim 17, further comprising the step of in the first mode of operation inputting the analog signal for the first period to the evaluation unit and storing the instantaneous value and subsequently in the first mode of operation inputting the analog signal for the second period to the evaluation unit and storing the instantaneous value and determining the instantaneous phase difference ($\Delta$phi) from the stored instantaneous values.

23. A position measuring process according to claim 17, further comprising the step of in the first mode of operation inputting the analog signal for the first period to an interpolation unit for determination of a first interpolated value and thereafter inputting the analog signal for the second period the same interpolation unit for determination of a second interpolated value and determining the low-resolution absolute position by comparing the first and second interpolated value.

24. A position measuring process according to claim 23, further comprising the step of in the second mode of operation inputting the analog signal for the second period continuously to the interpolation unit and inputting the interpolated value to a counter.

25. A position measuring process according to claim 21, further comprising the step of comparing a change in the counting state between the sampling of two reference marks following one after the other at a known interval to a predetermined value and depending on the result of the comparison generating an error signal.

\* \* \* \* \*

UNITED STATES PATENT AND TRADEMARK OFFICE
CERTIFICATE OF CORRECTION

PATENT NO. : 5,905,350
DATED : May 18, 1999
INVENTOR(S) : Hermann Hofbauer, et. al.

It is certified that error appears in the above-indentified patent and that said Letters Patent is hereby corrected as shown below:

In claim 10, line 3, please change ";" (semicolon) to --:-- (colon).

In claim 15, line 2, please change "an" to --a--.

In claim 16, line 2, please change "an" to --a--.

Signed and Sealed this

Tenth Day of April, 2001

*Attest:*

NICHOLAS P. GODICI

*Attesting Officer*      *Acting Director of the United States Patent and Trademark Office*